(12) United States Patent
Aikawa et al.

(10) Patent No.: US 12,394,656 B2
(45) Date of Patent: Aug. 19, 2025

(54) MOUNTING TABLE AND SUBSTRATE PROCESSING APPARATUS

(71) Applicant: TOKYO ELECTRON LIMITED, Tokyo (JP)

(72) Inventors: Katsuyoshi Aikawa, Tokyo (JP); Hiroshi Sone, Tokyo (JP); Shinji Orimoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 868 days.

(21) Appl. No.: 17/549,037

(22) Filed: Dec. 13, 2021

(65) Prior Publication Data

US 2022/0189813 A1    Jun. 16, 2022

(30) Foreign Application Priority Data

Dec. 14, 2020    (JP) .................................. 2020-206789

(51) Int. Cl.
*H01L 21/683*    (2006.01)
*H01L 21/67*    (2006.01)
*H01L 21/687*    (2006.01)

(52) U.S. Cl.
CPC .... *H01L 21/6833* (2013.01); *H01L 21/67103* (2013.01); *H01L 21/687* (2013.01)

(58) Field of Classification Search
CPC ........... H01L 21/6833; H01L 21/67013; H01L 21/67107; H01L 21/6831; H01L 21/687; H01L 21/68714; H01L 21/68735; H01L 21/68771; H01L 21/68778; H01L 21/68792
USPC .............................. 219/774, 444.1; 392/418
See application file for complete search history.

(56) References Cited

U.S. PATENT DOCUMENTS 10,903,093 B2    1/2021  Kubota et al.
2018/0182648 A1  6/2018  Kubota et al.

FOREIGN PATENT DOCUMENTS

| JP | 2004-342984 A | 12/2004 |
| JP | 2011-222931 A | 11/2011 |
| JP | 5270310 B2 | 8/2013 |
| JP | 2016-174096 A | 9/2016 |
| KR | 10-2012-0112661 A | 10/2012 |

*Primary Examiner* — Hung D Nguyen
(74) *Attorney, Agent, or Firm* — Fenwick & West LLP

(57) ABSTRACT

There is provided a mounting table. The mounting table comprises: a dielectric plate having a through-hole at an outer peripheral portion thereof and having a substrate support on which a substrate is placed; a support member; a first heat insulating member disposed between the dielectric plate and the support member; a first biasing member disposed between the first heat insulating member and the support member, and a fastening member configured to detachably fix the dielectric plate to the support member by way of penetrating through the through-hole of the dielectric plate, the first heat insulating member, and the first biasing member.

8 Claims, 5 Drawing Sheets

MOUNTING TABLE AND SUBSTRATE PROCESSING APPARATUS

CROSS-REFERENCE TO RELATED APPLICATIONS

This application claims priority to Japanese Patent Application No. 2020-206789 filed on Dec. 14, 2020, the entire contents of which are incorporated herein by reference.

TECHNICAL FIELD

The present disclosure relates to a mounting table and a substrate processing apparatus.

BACKGROUND

A substrate processing apparatus having a mounting table on which a substrate is placed in a chamber is known. Japanese Patent Publication No. 5270310 discloses a substrate processing apparatus in which a susceptor having an electrostatic chuck is disposed in a processing chamber.

SUMMARY

A dielectric plate (electrostatic chuck) of the mounting table disposed in the chamber is replaced during maintenance of the substrate processing apparatus, for example. Therefore, it is required to improve the maintenance of the mounting table.

In one aspect, the present disclosure provides a mounting table whose maintenance is improved and a substrate processing apparatus.

In accordance with an aspect of the present disclosure, there is provided a mounting table comprising: a dielectric plate having a through-hole at an outer peripheral portion thereof and having a substrate support on which a substrate is placed; a support member; a first heat insulating member disposed between the dielectric plate and the support member; a first biasing member disposed between the first heat insulating member and the support member, and a fastening member configured to detachably fix the dielectric plate to the support member by way of penetrating through the through-hole of the dielectric plate, the first heat insulating member, and the first biasing member.

BRIEF DESCRIPTION OF THE DRAWINGS

The objectives and features of the present disclosure will become apparent from the following description of embodiments, given in conjunction with the accompanying drawings, in which.

DETAILED DESCRIPTION

Figure 1:
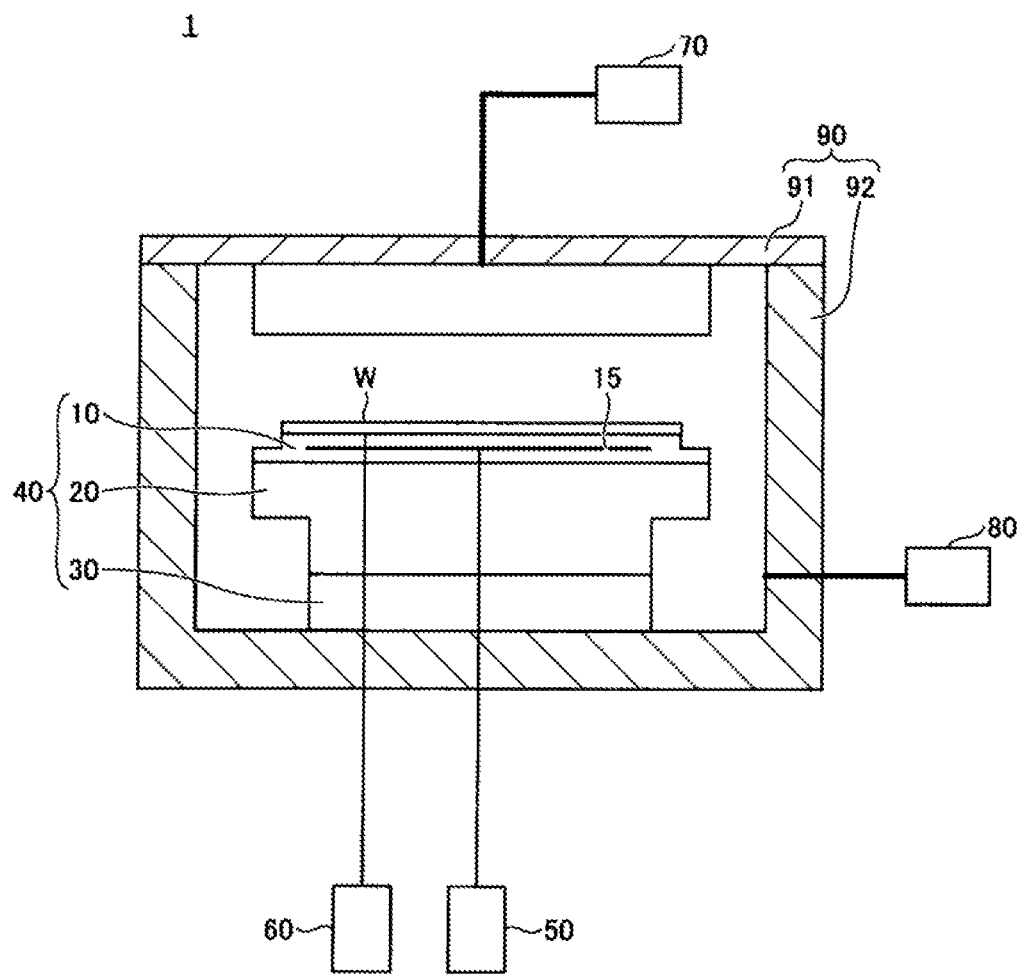
FIG. 1 is an example of a schematic cross-sectional view of a substrate processing apparatus according to an embodiment.

Hereinafter, embodiments for carrying out the present disclosure will be described with reference to the accompanying drawings. Like reference numerals will be given to like parts having substantially the same configurations throughout this specification and the drawings, and redundant description thereof will be omitted.

A substrate processing apparatus 1 according to an embodiment will be described with reference to FIG. 1. FIG. 1 is an example of a schematic cross-sectional view of the substrate processing apparatus 1 according to the embodiment. The substrate processing apparatus 1 includes a stage (mounting table) 40, a power supply 50, a heat transfer gas supply device 60, a processing gas supply device 70, an exhaust device 80, and a chamber 90.

The chamber 90 has a lid 91 and a container 92. The container 92 opens upward. The lid 91 closes the opening of the container 92 to make the chamber 90 airtight. A stage 40 on which a substrate W to be processed is placed is disposed in the chamber 90. The stage 40 has an electrostatic chuck 10, a stand 20, and a water-cooling flange 30.

The electrostatic chuck 10 attracts and supports the substrate W placed on a substrate support 11 (see FIG. 2 to be described later). The electrostatic chuck 10 is formed of a dielectric plate and is made of ceramic (e.g., alumina or the like). A heater 15 for adjusting a temperature of the substrate support 11 on which the substrate W is placed is disposed in the electrostatic chuck 10. The heater 15 may be divided into a plurality of zones in a circumferential direction and/or a radial direction of the electrostatic chuck 10, and the temperatures in the zones can be controlled individually. Further, the electrostatic chuck 10 has an electrode (not shown) for electrostatically attracting the substrate W.

The electrostatic chuck 10 can be attached to and detached from the stand 20. The stand 20 supports the electrostatic chuck 10. The water-cooling flange 30 supports the stand 20. A channel (not shown) through which cooling water circulates is formed in the water-cooling flange 30. Accordingly, when the substrate processing apparatus 1 performs desired processing on the substrate W, the water-cooling flange 30 has a temperature lower than that of the electrostatic chuck 10. The structure of the stage 40 will be described later with reference to FIGS. 2 to 6.

The power supply 50 supplies a power to the heater 15 of the electrostatic chuck 10. Further, the substrate processing apparatus 1 includes a power supply (not shown) for supplying a power to an electrode (not shown) for electrostatic attraction in the electrostatic chuck 10. For example, when a DC voltage is applied to the electrode for electrostatic attraction, the substrate W is attracted and held on the electrostatic chuck 10 by a Coulomb force.

The heat transfer gas supply device 60 supplies a heat transfer gas (e.g., He gas) to a space between the substrate W and the electrostatic chuck 10. Accordingly, thermal conductivity between the substrate W and the electrostatic chuck 10 is improved.

The processing gas supply device 70 supplies a processing gas into the chamber 90. The exhaust device 80 exhausts the gas in the chamber 90.

With the above configuration, in the substrate processing apparatus 1, the substrate W placed on the stage 40 is attracted on the electrostatic chuck 10. Then, in the substrate processing apparatus 1, the heater 15 is controlled to control the temperature of the substrate W. For example, the temperature of the substrate W is controlled such that in-plane uniformity can be ensured. In the substrate processing apparatus 1, the atmosphere in the chamber 90 is set to a desired vacuum atmosphere using the exhaust device 80, and a desired processing (e.g., film formation, etching, or the like) is performed on the substrate W placed on the stage (substrate support) 40 by supplying the processing gas from the processing gas supply device 70 into the chamber 90.

<Stage>

Figure 3:
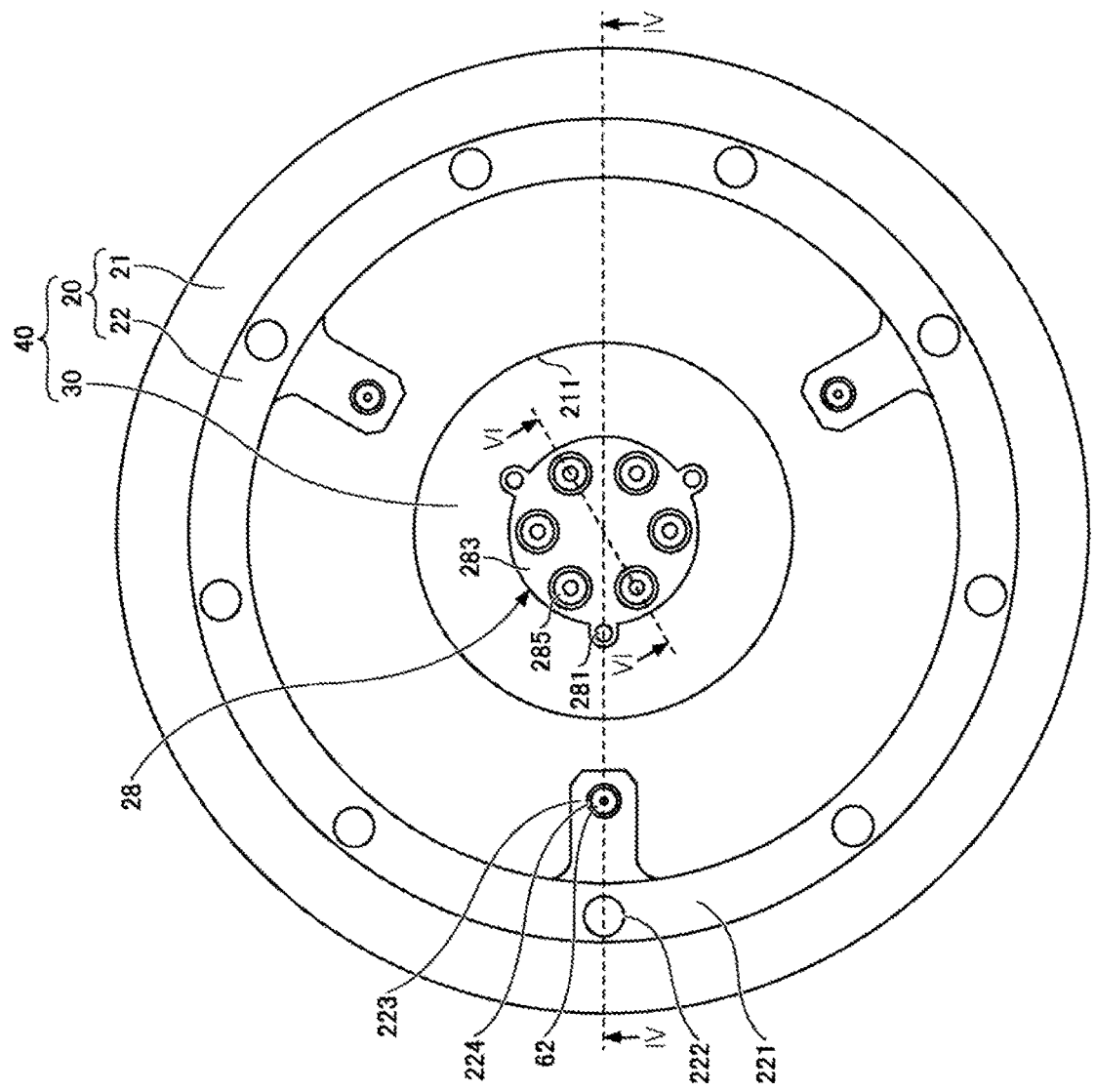
FIG. 3 is an example of a top view of a stage from which the electrostatic chuck is removed.
Figure 4:
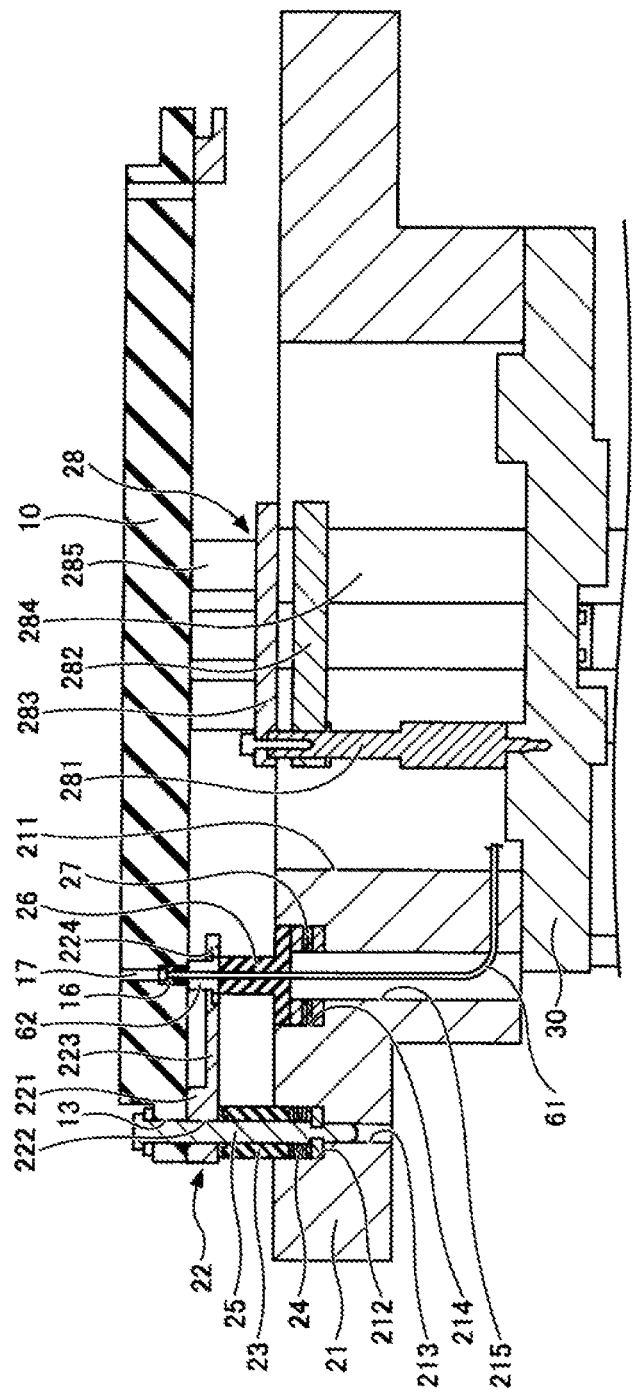
FIG. 4 is an example of a cross-sectional view of the stage.

Next, the structure of the stage 40 on which the substrate W is placed will be further described with reference to FIGS. 2 to 6. FIG. 2 is an example of a side view of the electrostatic chuck 10. FIG. 3 is an example of a top view of the stage 40 from which the electrostatic chuck 10 is removed. FIG. 4 is an example of a cross-sectional view of the stage 40 taken along a line IV-IV (see FIG. 3).

Figure 2:
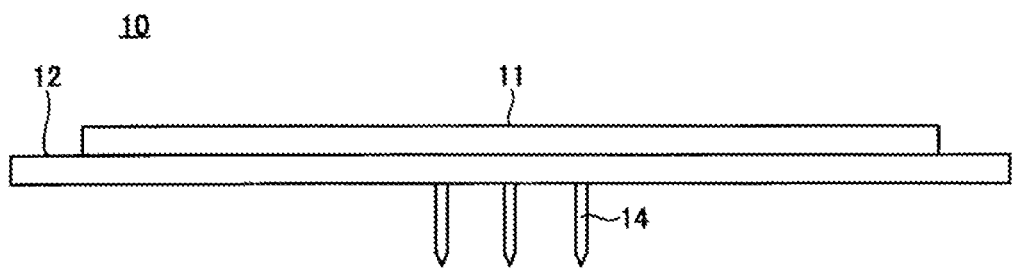
FIG. 2 is an example of a side view of an electrostatic chuck.

As shown in FIG. 2, the electrostatic chuck 10 has the substrate support 11 on which the substrate W is placed, and an outer peripheral portion 12. A plurality of through-holes 13 (see FIG. 4) through which bolts 25 (see FIG. 4) are inserted are formed in the outer peripheral portion 12 of the electrostatic chuck 10. The electrostatic chuck 10 is detachably fixed to the stand 20 using the bolts 25.

A plurality of contact pins 14 stands upright on a back surface side of the electrostatic chuck 10. The contact pins 14 are connected to the heater 15 disposed in the dielectric plate of the electrostatic chuck 10 or the electrode (not shown) for electrostatic attraction. When the electrostatic chuck 10 is attached to the stand 20, the contact pins 14 are electrically connected to sockets 285 (see FIGS. 3 and 4) of the stand 20.

Further, as shown in FIG. 4, a nozzle insertion portion 16 into which the nozzle 62 is inserted is formed on the back surface side of the electrostatic chuck 10. Further, a gas channel 17 extends from the nozzle insertion portion 16 to the substrate support 11 of the electrostatic chuck 10. When the electrostatic chuck 10 is attached to the stand 20, the nozzle 62 is inserted into the nozzle insertion portion 16. Accordingly, the heat transfer gas supplied from the nozzle 62 is supplied from the nozzle insertion portion 16 to the space between the substrate support 11 of the electrostatic chuck 10 and the substrate W (see FIG. 1) while passing through the gas channel 17.

The stand (support member) 20 includes a shaft 21, an annular member 22, a heat insulating member 23, and a biasing member 24.

The shaft 21 has a hollow portion 211 penetrating the center thereof in a vertical direction. Further, the shaft 21 has a flange shape in which an upper side is widened. A cylindrical recessed portion 212 is formed on an upper surface of the shaft 21. Further, a female screw hole 213 having a diameter smaller than that of the recessed portion 212 is formed on a bottom surface of the recessed portion 212.

The annular member 22 has an annular portion 221. Through-holes 222 through which the bolts 25 (see FIG. 4) are inserted are formed in the annular portion 221. Further, a nozzle guide 223 is disposed toward an inner side of the annular portion 221. The nozzle guide 223 has a hole 224 through which the nozzle 62 is inserted. The hole 224 is formed larger than the nozzle 62, so that the nozzle 62 can move through the hole 224.

The heat insulating member 23 is a cylindrical member through which the bolt 25 can be inserted, and is made of, e.g., ceramic or the like.

The biasing member 24 is a member through which the bolt 25 can be inserted and biases the bolt 25 in the axial direction. The biasing member 24 may be, e.g., a spring washer, a disc spring, or the like.

The bolt 25 has a head portion, a shaft portion, and a screw portion.

<Method for Fixing the Electrostatic Chuck 10>

Figure 5:
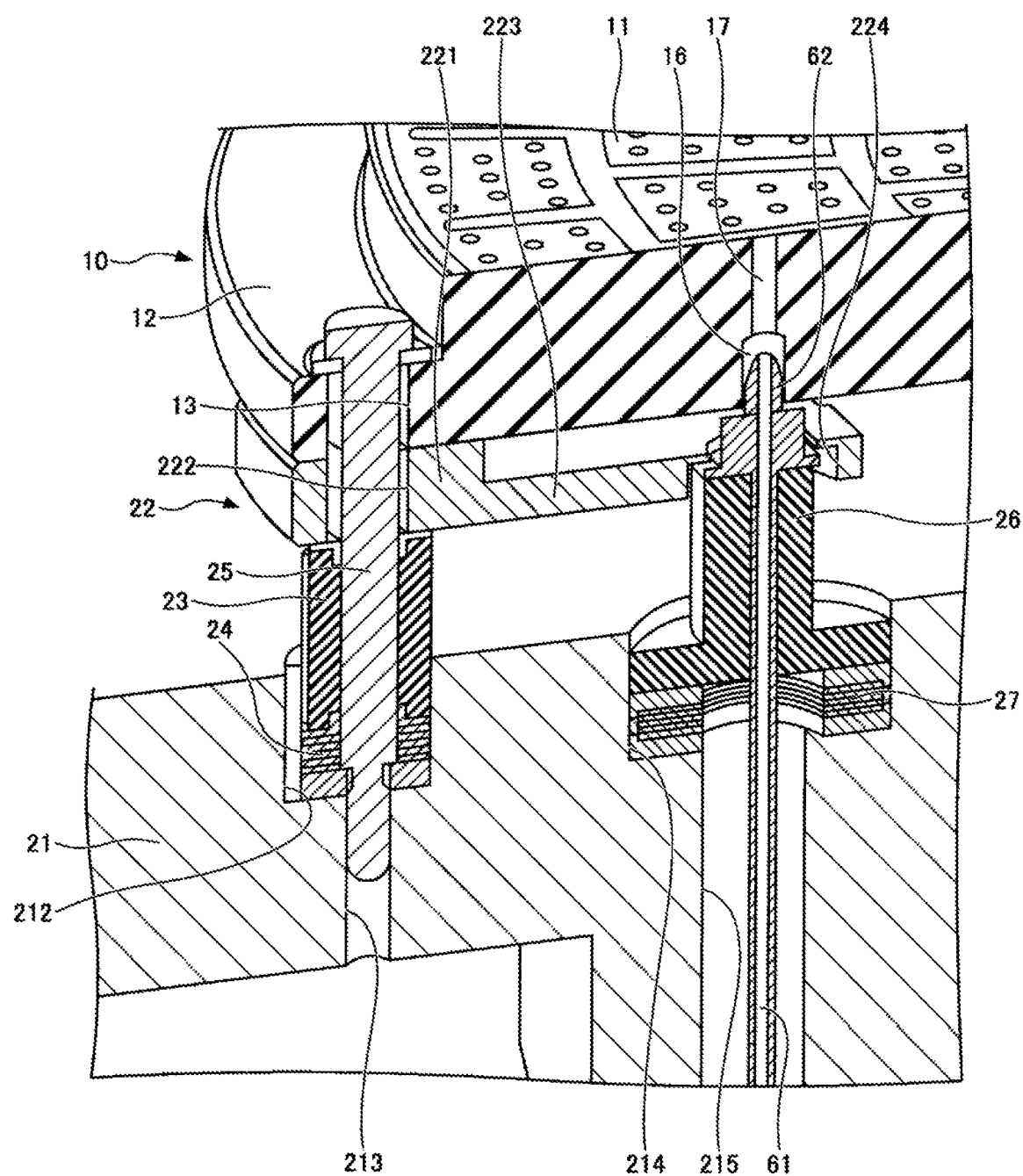
FIG. 5 is an example of a partially enlarged cross-sectional perspective view of the stage.

Next, a method for fixing the electrostatic chuck 10 will be described with reference to FIGS. 4 and 5. FIG. 5 is an example of a partially enlarged cross-sectional perspective view of the stage 40 taken along a line IV-IV (see FIG. 3). The biasing member 24 is disposed at the recessed portion 212 of the shaft 21, and the heat insulating member 23 is disposed thereon. The annular member 22 is disposed on the heat insulating member 23. The electrostatic chuck 10 is disposed on the annular member 22. The bolts 25 penetrate through the through-holes 13 of the electrostatic chuck 10, the through-holes 222 of the annular member 22, the heat insulating member 23, and the biasing member 24. The electrostatic chuck 10 can be fixed to the stand 20 by screwing the screw portion of the bolt 25 into the female screw hole 213.

When the substrate W is processed, the electrostatic chuck 10 is heated by the heater 15. On the other hand, the shaft 21 is fixed to the water-cooling flange 30. In the stage 40 of the present embodiment, the electrostatic chuck 10 is fixed to the shaft 21 via the heat insulating member 23, so that heat leakage from the electrostatic chuck 10 to the shaft 21 can be suppressed. Accordingly, the temperature uniformity of the substrate support 11 of the electrostatic chuck 10 can be improved.

Further, the inner diameters of the through-hole 13 of the electrostatic chuck 10 and the through-hole 222 of the annular member 22 are formed greater than the outer diameter of the shaft portion of the bolt 25. Therefore, even if there is a difference in thermal expansion of the electrostatic chuck 10, the annular member 22, and the shaft 21, sliding occurs at the interface thereof and, thus, the generation of thermal stress can be suppressed.

Since the biasing member 24 can be disposed between the heat insulating member 23 and the shaft 21 having a temperature lower than that of the electrostatic chuck 10, the biasing member 24 having low heat resistance can also be used. In other words, various materials can be selected for the biasing member 24.

<Method for Connecting the Heat Transfer Gas Nozzle 62>

Next, a method for fixing the electrostatic chuck 10 will be described with reference to FIGS. 2 to 5. The nozzle 62 is connected to the heat transfer gas supply device 60 (see FIG. 1) through a heat transfer gas supply line 61.

A cylindrical recessed portion 214 is formed on the upper surface of the shaft 21. Further, a hole 215 having a diameter smaller than that of the recessed portion 214 is formed on the bottom surface of the recessed portion 214. A biasing member 27 is disposed at the recessed portion 214 of the shaft 21, and a heat insulating member 26 is disposed on the biasing member 27. The nozzle 62 is disposed on the heat insulating member 26. The horizontal movement of the nozzle 62 is guided by the hole 224 of the nozzle guide 223.

When the electrostatic chuck 10 is fixed to the shaft 21, the nozzle 62 is guided by the nozzle guide 223 and, thus, the nozzle 62 can be easily inserted into the nozzle insertion portion 16 of the electrostatic chuck 10. Then, by fixing the electrostatic chuck 10 to the shaft 21 using the bolts 25, the nozzle 62 can be press-fitted into the nozzle insertion portion 16. In addition, a sealing member (not shown) may be disposed between the nozzle 62 and the nozzle insertion portion 16.

In the stage 40 of the present embodiment, the nozzle 62 is supported by the shaft 21 via the heat insulating member 26, so that heat leakage from the electrostatic chuck 10 to the shaft 21 can be suppressed. Accordingly, the temperature uniformity of the substrate supporting portion 11 of the electrostatic chuck 10 can be improved.

Since the biasing member 27 can be disposed between the heat insulating member 26 and the shaft 21 having a temperature lower than that of the electrostatic chuck 10, the biasing member 27 having low heat resistance can also be used. In other words, various materials can be selected for the biasing member 27.

<Method for Connecting the Contact Pins 14>

Figure 6:
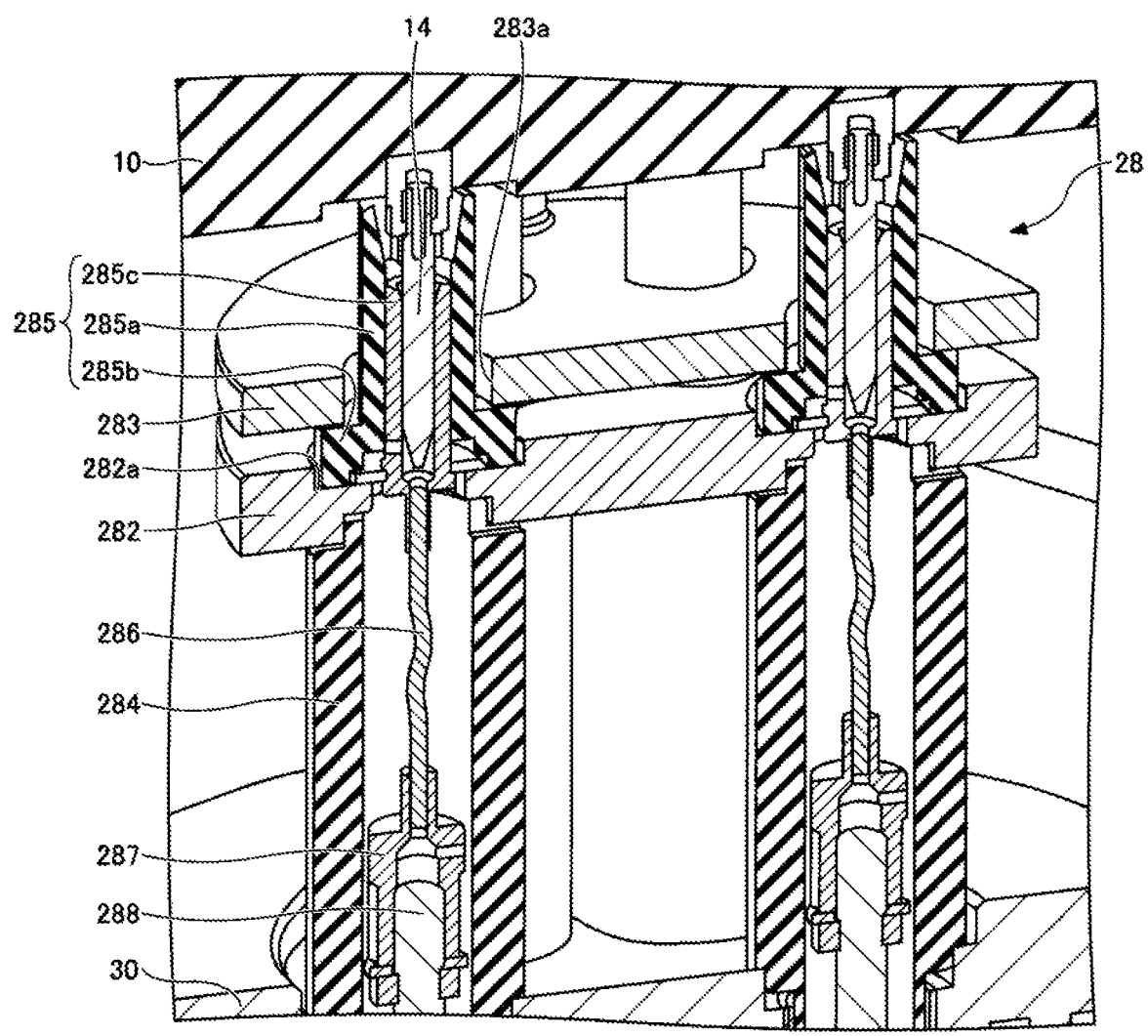
FIG. 6 is an example of a partially enlarged cross-sectional perspective view of the stage.

Next, a method for connecting the contact pins 14 will be described with reference to FIGS. 2 to 4 and 6. FIG. 6 is an example of a partially enlarged cross-sectional perspective view of the stage 40 taken along a line VI-VI (see FIG. 3). The hollow portion 211 of the shaft 21 is provided with a contact 28 that stands upright from the water-cooling flange 30.

The contact 28 has a columnar member 281, a lower plate member 282, an upper plate member 283, a tubular member 284, a socket 285, a stranded wire 286, and a connector 287. The columnar member 281 stands upright from the water-cooling flange 30 and supports the lower plate member 282 and the upper plate member 283. A recessed portion 282a is formed at the lower plate member 282. A bottom surface of the recessed portion 282a is penetrated. A through-hole 283a is formed in the upper plate member 283.

The socket 285 has a shaft portion 285a, a flange portion 285b, and a terminal 285c. The inner diameter of the recessed portion 282a is formed greater than the outer diameter of the flange portion 285b, and the inner diameter of the through-hole 283a is formed greater than the outer diameter of the shaft portion 285a. Therefore, the socket 285 can be moved in the horizontal direction. On the other hand, the outer diameter of the flange portion 285b is formed greater than the inner diameter of the through-hole 283a, so that the movement of the socket 285 in the vertical direction is restricted.

The tubular member 284 is disposed between the lower plate member 282 and the water-cooling flange 30. The connector 287 is disposed below the tubular member 284. An electrode pin 288 is connected to the connector 287. The terminal 285c and the connector 287 are connected by the flexible stranded wire 286.

In accordance with the stage 40, the electrostatic chuck 10 can be easily removed from the stand 20 (shaft 21) by removing the bolts 25. Further, the connection of the heat transfer gas path (the fitting of the nozzle insertion portion 16 and the nozzle 62) and the connection of the electrical path (the connection between the contact pins 14 and the sockets 285) can be easily released. Further, when the electrostatic chuck 10 is attached to the stand 20 (the shaft 21), it can be easily attached by fastening with the bolts 25. Further, the connection of the heat transfer gas path (the fitting of the nozzle insertion portion 16 and the nozzle 62) and the connection of the electrical path (the connection between the contact pins 14 and the sockets 285) can be easily realized.

In the case of replacing the electrostatic chuck 10 from the stage 40 in the chamber 90, by removing the lid 91 of the chamber 90, it is possible to attach/detach the bolts 25 and the electrostatic chuck 10 by an operation from the upper opening of the container 92. Accordingly, the operation during the maintenance of the electrostatic chuck 10 is improved. Further, in the case of replacing the electrostatic chuck 10, an operation from the side or the bottom of the chamber 90 is not required, so that the operation space can be reduced.

Further, even if the stage 40 thermally expands and there is a difference in thermal expansion of the components, sliding occurs at the interface between the electrostatic chuck 10 and the annular member 22 and at the interface between the annular member 22 and the heat insulating member 23. Accordingly, the generation of thermal stress can be suppressed.

Further, the socket 285 is supported to be movable in the horizontal direction, and the terminal 285c of the socket 285 and the connector 287 are connected by the stranded wire 286. Thus, the misalignment of the contact pin 14 can be mitigated. Accordingly, when the contact pin 14 is inserted into the socket 285, it is possible to suppress load applied to the electrostatic chuck 10.

Although the mounting table and the substrate processing apparatus according to the embodiments of the present disclosure have been described, the mounting table and the substrate processing apparatus of the present disclosure are not limited to those in the above-described embodiments, and various modifications and improvements can be made within the scope of the present disclosure. The above-described embodiments can be combined without contradicting processing contents thereof The substrate processing apparatus of the present disclosure may be a plasma processing apparatus that generates plasma in the processing space and processes the substrate. The plasma processing apparatus can be applied to any type of apparatus using capacitively coupled plasma (CCP), inductively coupled plasma (ICP), a radial line slot antenna, electron cyclotron resonance (ECR) plasma, and helicon wave plasma (HWP).

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A mounting table comprising:

a dielectric plate having a first through-hole at an outer peripheral portion thereof and having a substrate support on which a substrate is placed;

a shaft;

a first heat insulating member disposed between the dielectric plate and the shaft;

a first biasing member disposed between the first heat insulating member and the shaft, the first heat insulating member being disposed on the first biasing member; and a fastening member configured to detachably fix the dielectric plate to the shaft by way of penetrating through the first through-hole of the dielectric plate, the first heat insulating member, and the first biasing member, wherein the shaft has a first recessed portion formed on an upper surface of the shaft, and the first biasing member and a lower end of the first heat insulating member are disposed at the first recessed portion.

2. The mounting table of claim 1, wherein an inner diameter of the first through-hole of the dielectric plate is greater than the outer diameter of the fastening member inserted into the first through-hole.

3. The mounting table of claim 1, further comprising:
an annular member disposed between the dielectric plate and the first heat insulating member and having a second through-hole through which the fastening member is inserted.

4. The mounting table of claim 3, wherein the dielectric plate has a gas channel through which a heat transfer gas circulates, and
the annular member has a guide configured to guide a nozzle of the heat transfer gas to the gas channel.

5. The mounting table of claim 4, further comprising:
a second heat insulating member disposed between the nozzle and the shaft; and
a second biasing member disposed between the second heat insulating member and the shaft;
wherein the shaft has a second recessed portion, and
the second biasing member and a lower end of the second heat insulating member are disposed at the second recessed portion.

6. The mounting table of claim 1, wherein the dielectric plate has a contact pin, and
a connector connected to the contact pin is supported to be movable in a horizontal direction.

7. A substrate processing apparatus comprising:
a mounting table comprising:
a dielectric plate having a first through-hole at an outer peripheral portion thereof and having a substrate support on which a substrate is placed,
a shaft,
a first heat insulating member disposed between the dielectric plate and the shaft,
a first biasing member disposed between the first heat insulating member and the shaft, the first heat insulating member being disposed on the first biasing member, and
a fastening member configured to detachably fix the dielectric plate to the shaft by way of penetrating through the first through-hole of the dielectric plate, the first heat insulating member, and the first biasing member; and
a chamber accommodating the mounting table,
wherein the shaft has a first recessed portion formed on an upper surface of the shaft, and
the first biasing member and a lower end of the first heat insulating member are disposed at the first recessed portion.

8. The substrate processing apparatus of claim 7, wherein the chamber includes a container having an opening at an upper portion thereof and a lid that closes the opening of the container.

\* \* \* \* \*